(12) United States Patent
Bieri et al.

(10) Patent No.: US 10,209,331 B2
(45) Date of Patent: Feb. 19, 2019

(54) MAGNETIC RESONANCE IMAGING METHOD WITH ASYMMETRIC RADIAL ACQUISITION OF K-SPACE DATA

(71) Applicant: Universitatsspital Basel, Basel (CH)

(72) Inventors: Oliver Bieri, Liestal (CH); Grzegorz Bauman, Basel (CH)

(73) Assignee: Universitätsspital Basel, Basel (CH)

(*) Notice: Subject to any disclaimer, the term of this patent is extended or adjusted under 35 U.S.C. 154(b) by 303 days.

(21) Appl. No.: 15/151,783

(22) Filed: May 11, 2016

(65) Prior Publication Data

US 2016/0334488 A1 Nov. 17, 2016

(30) Foreign Application Priority Data

May 11, 2015 (DE) .................. 10 2015 107 347

(51) Int. Cl.
*G01R 33/561* (2006.01)
*G01R 33/48* (2006.01)
G01R 33/565 (2006.01)

(52) U.S. Cl.
CPC ...... *G01R 33/4824* (2013.01); *G01R 33/4826* (2013.01); *G01R 33/565* (2013.01)

(58) Field of Classification Search
USPC ................ 324/300–322; 600/407–435; 382/128–131
See application file for complete search history.

(56) References Cited

U.S. PATENT DOCUMENTS 9,498,648 B2 * 11/2016 Overweg ............ A61N 5/1049
2010/0194389 A1 * 8/2010 Sutton ............... G01R 33/4806
324/309

(Continued)

FOREIGN PATENT DOCUMENTS

DE 102011077197 B4 12/2012
DE 102013213940 B3 1/2015

OTHER PUBLICATIONS

Barger, Andrew V. et al., Time-Resolved Contrast-Enhanced Imaging With Isotropic Resolution and Broad Coverage Using an Undersampled 3D Projection Trajectory, Magnetic Resonance in Medicine, 2002, 297-305, 48, Wiley-Liss, Inc.

(Continued)

*Primary Examiner* — Tung X Nguyen
*Assistant Examiner* — Robert P Alejnikov, Jr.
(74) *Attorney, Agent, or Firm* — The Webb Law Firm

(57) ABSTRACT

A magnetic resonance imaging (MRI) method is provided in which a sample is subjected to a gradient echo imaging sequence having a plurality of basic sequence elements each of which includes a radiofrequency (RF) pulse, at least one frequency encoding gradient moment $k_x$ for generating a magnetic resonance (MR) signal, at least one first phase encoding gradient moment $k_y$ for phase encoding the MR signal and a data acquisition period during which k-space data reflecting the MR signal are acquired. The frequency encoding gradient moment $k_x$ and the first phase encoding gradient moment $k_y$ are applied such during the data acquisition period of each basic sequence element, that the k-space data are acquired in a radial direction and asymmetrically with respect to the center of k-space in the direction from the periphery towards the center of k-space.

10 Claims, 5 Drawing Sheets

(56) References Cited

U.S. PATENT DOCUMENTS

| | | | | |
|---|---|---|---|---|
| 2010/0296717 | A1* | 11/2010 | Takizawa | G01R 33/4824 |
| | | | | 382/131 |
| 2012/0313640 | A1* | 12/2012 | Pfeuffer | A61B 5/055 |
| | | | | 324/309 |
| 2013/0281828 | A1* | 10/2013 | Stemmer | G01R 33/5673 |
| | | | | 600/413 |
| 2014/0292330 | A1* | 10/2014 | Gulani | G01R 33/3614 |
| | | | | 324/309 |
| 2015/0126850 | A1* | 5/2015 | Cetingul | G01R 33/56 |
| | | | | 600/413 |

OTHER PUBLICATIONS

Bauman, Grzegorz et al., Three-Dimensional Pulmonary Perfusion MRI With Radial Ultrashort Echo Time and Spatial-Temporal Constrained Reconstruction, Magnetic Resonance in Medicine, Feb. 2015, 555-64, 73(2), Wiley Periodicals, Inc.

Bieri, Oliver, Ultra-Fast Steady State Free Precession and Its Application to In Vivo (1)H Morphological and Functional Lung Imaging At 1.5 Tesla, Magnetic Resonance in Medicine, Jun. 28, 2013, 657-663, 70, Wiley Periodicals, Inc.

Candès, Emamnuel J., Compressive Sampling, 2006, 1-20, International Congress of Mathematicians, Madrid, Spain.

Crèmillieux, Yannick et al., Projection-Reconstruction Methods: Fast Imaging Sequences and Data Processing, Magnetic Resonance in Medicine, 1994, 23-32, 32, Williams & Wilkins.

Deshpande, Vibhas S. et al., Reduction of Transient Signal Oscillations in True-FISP Using a Linear Flip Angle Series Magnetization Preparation, Magnetic Resonance in Medicine, 2003, 151-157, 49, Wiley-Liss, Inc.

Johnson, Kevin M. et al., Optimized 3D Ultrashort Echo Time Pulmonary MRI, Magnetic Resonance in Medicine, 2013, 1241-1250, 70, Wiley Periodicals, Inc.

Lustig, Michael et al., Sparse MRI: The Application of Compressed Sensing for Rapid MR Imaging, Magnetic Resonance in Medicine, 2007, 1182-1195, 58, Wiley-Liss, Inc.

Peters, Dana C. et al., Centering the Projection Reconstruction Trajectory: Reducing Gradient Delay Errors, Magnetic Resonance in Medicine, 2003, 1-6, 50, Wiley-Liss, Inc.

Peters, Dana C. et al., Undersampled Projection Reconstruction Applied to MR Angiography, Magnetic Resonance in Medicine, Jan. 2000, 91-101, 43(1), Wiley-Liss, Inc.

Rasche, Volker et al., Continuous Radial Data Acquisition for Dynamic MRI, Magnetic Resonance in Medicine, Nov. 1995, 754-61, 34(5), Williams & Wilkins.

Togao, Osamu et al., Ultrashort Echo Time (UTE) MRI of the Lung: Assessment of Tissue Density in the Lung Parenchyma, Magnetic Resonance in Medicine, 2010, 1491-1498, 64, Wiley-Liss, Inc.

Winkelmann, Stefanie et al., An Optimal Radial Profile Order Based on the Golden Ratio for Time-Resolved MRI, IEEE Transactions on Medical Imaging, Jan. 2007, 68-76, 26(1), IEEE.

Wu, Yan et al., Ce-Mra of the Lower Extremities Using HYPR Stack-of-Stars, Journal of Magnetic Resonance Imaging, 2009, 917-923, 29, Wiley-Liss, Inc.

\* cited by examiner

MAGNETIC RESONANCE IMAGING METHOD WITH ASYMMETRIC RADIAL ACQUISITION OF K-SPACE DATA

CROSS-REFERENCE TO RELATED APPLICATION

This application claims priority to German Patent Application No. 10 2015 107 347.1 filed May 11, 2015, the disclosure of which is hereby incorporated in its entirety by reference.

TECHNICAL FIELD

The present invention concerns a magnetic resonance imaging (MRI) method in which a sample is subjected to a gradient echo imaging sequence with asymmetric radial acquisition of k-space data. The present invention also concerns a MRI system configured to carry out such a MRI method as well as a computer program for controlling a MRI system, the computer program comprising executable instructions to carry out such a MRI method.

BACKGROUND OF THE INVENTION

Magnetic resonance imaging (MRI) is a well-known medical imaging technique that allows visualizing internal structures of the human (and the animal) body in great detail.

With gradient echo sequences, which are widely used in MRI, the nuclear spins of a sample are excited by less than 90° by means of radiofrequency (RF) pulses. Magnetic gradient fields are then used to dephase and refocus the transverse magnetization of the excited nuclear spins.

A gradient echo sequence which is often used for rapid imaging purposes is balanced steady-state free precession (balanced SSFP). With balanced SSFP which is also known under the acronym TrueFISP (for 'true fast imaging with steady-state precession'), the magnetization is allowed to accumulate a constant phase within every repetition time (TR) interval by fully rephasing the transverse magnetization between successive RF pulses, i.e. within every TR. As a result, balanced SSFP shows a mixed T2/T1-weighting offering a bright fluid signal and an overall improved signal-to-noise ratio (SNR) in comparison to incoherent SSFP pulse sequences, such as spoiled gradient echo (SPGR). Over the last two decades, balanced SSFP imaging has become increasingly popular for applications where rapid data acquisition is needed, e.g., for cardiac imaging, native magnetic resonance angiography, or thoracic imaging, but remains challenging even on current state-of-the-art MRI systems, since for constant phase accruals, all gradient moments have to be perfectly balanced within every TR. As a result, balanced SSFP imaging is prone to any source of imperfection that perturbs the perfectly balanced gradient scheme, such as eddy-currents.

Similarly, balanced SSFP imaging shows a pronounced sensitivity to off-resonances leading to a periodic modulation of the steady state having high intensity signal regions, frequently referred to as 'pass-band' regions, and so-called 'stop-bands' or 'banding artifacts', where the signal comes close to zero. Hence, imaging of tissues with high susceptibility variations (e.g., lung parenchyma, bone tissue, cartilage), becomes challenging and requires proper shimming to achieve an excellent main magnetic field homogeneity. Alternatively, banding can be effectively mitigated by shortening the TR and has become available only with the introduction of very fast, strong and precise gradient systems. Recently, it has been demonstrated that the TR of Cartesian balanced SSFP imaging can be pushed close to about 1 ms on a typical whole-body MRI system, providing artifact-free chest imaging at 1.5 T (Bieri O. Ultra-fast steady state free precession and its application to in vivo (1) H morphological and functional lung imaging at 1.5 Tesla. Magn Reson Med. 2013 Jun. 28. doi: 10.1002/mrm.24858). One of the major limitations of contemporary Cartesian sampling schemes, however, is its inherent sensitivity to motion, resulting in shifted copies ("ghosting artifacts") of the object along the phase-encoding direction.

A possible strategy to mitigate motion sensitivity, is to use non-Cartesian encoding schemes, such as the acquisition of k-space data in radial directions (Crémillieux Y, Briguet A, Deguin A. Projection-reconstruction methods: fast imaging sequences and data processing. Magn Reson Med 1994; 32:23-32, Rasche V, de Boer R W, Holz D, Proksa R. Continuous radial data acquisition for dynamic MRI. Magn Reson Med. 1995 November; 34(5):754-61). With radial acquisition, the data is acquired along a plurality of rotated radial spokes in k-space. Here, the k-space center is acquired at every TR and overlapping radial spokes have a strong motion averaging effect. The remaining signal energy produced by the patient's motion spreads over the image in form of streaking artifacts radiating from the motion-affected region, which usually only has a mild effect on the image quality. In addition, due to the frequent sampling of the k-space center, radial imaging is also well suited for time-resolved reconstruction (Barger A V, Block W F, Toropov Y, Grist T M, Mistretta C A. Time-resolved contrast-enhanced imaging with isotropic resolution and broad coverage using an undersampled 3D projection trajectory. Magn Reson Med 2002; 48:297-305, Winkelmann S, Schaeffter T, Koehler T, Eggers H, Doessel O. An optimal radial profile order based on the Golden Ratio for time-resolved MRI. IEEE Trans Med Imaging. 2007 January; 26(1):68-76, Bauman G, Johnson K M, Bell L C, Velikina J V, Samsonov A A, Nagle S K, Fain S B. Three-dimensional pulmonary perfusion MRI with radial ultrashort echo time and spatial-temporal constrained reconstruction. Magn Reson Med. 2015 February; 73(2):555-64).

Similar to Cartesian MRI, the sampling density of a fully sampled radial dataset is determined by the Nyquist limit and undersampling will thus results in streaking artifacts in the image. However, due to spatial incoherences of the undersampling artifacts, radial imaging is well suited for the application of an advanced reconstruction approach such as compressed sensing (Candes E J. Compressive sampling. Madrid, Spain: Intl Congress of Mathematicians; 2006, Lustig M, Donoho D, Pauly J M. Sparse MRI: the application of compressed sensing for rapid MR imaging. Magn Reson Med 2007; 58:1182-1195). Nevertheless, radial trajectories have higher sampling requirements than Cartesian methods as a result of a less efficient k-space coverage. This becomes especially critical for three-dimensional (3D) imaging, where radial imaging leads to prolonged acquisition times. Here, an interesting alternative represents the use of a 3D stack-of-stars sampling scheme (Peters D C, Korosec F R, Grist T M, Block W F, Holden J E, Vigen K K, Mistretta C A. Undersampled projection reconstruction applied to MR angiography. Magn Reson Med. 2000 January; 43(1):91-101, Wu Y, Korosec F R, Mistretta C A, and Wieben O. CE-MRA of the lower extremities using HYPR stack-of-stars. J Magn Reson Imaging 2009; 29:917-923). This approach combines two-dimensional (2D) radial sampling in the plane and Cartesian encoding along the third dimension, which is more time-efficient than a full 3D radial coverage, i.e. the acquisition of a 3D star of data formed by radial spokes in k-space.

Although conceptually, radial data acquisition is known since the early days of MRI, its application in the clinical setting is still limited due to technical challenges. A major issue represents proper data reconstruction in the presence of even tiny deviations from the nominal k-space trajectory, e.g., caused by gradient system imperfections, such as eddy currents or heating effects and internal synchronization errors. In general, any discrepancy between the nominal and actual k-space trajectory results in data inconsistencies, i.e., perpendicular and parallel offset of the central k-space point with respect to the k-space center emanating in the image as increased diffuse background noise ('smearing' artifacts or 'halo-effect'). This effect becomes especially prominent for half-echo centered-out acquisition schemes, such as ultra-short echo time (UTE) SPGR sequences (Johnson K M, Fain S B, Schiebler M L, Nagle S. Optimized 3D ultrashort echo time pulmonary MRI. Magn Reson Med 2013; 70:1241-1250, Togao O, Tsuji R, Ohno Y, Dimitrov I, Takahashi M. Ultrashort echo time (UTE) MRI of the lung: assessment of tissue density in the lung parenchyma. Magn Reson Med 2010; 64:1491-1498), where data sampling starts directly in the k-space center, such that data are acquired in radial directions from the center towards the periphery of k-space. For UTE sequences the major methodological advance of the half-echo acquisition scheme relates to the substantial shortening of the echo time (TE), whereas for balanced SSFP it would offer a shortened TR and thus a reduction of banding artifacts. Unfortunately, centered-out half-radial sampling in combination with balanced SSFP imaging is particularly affected by the aforementioned MRI-system imperfections.

SUMMARY OF THE INVENTION

It is an object of the present invention to provide a magnetic resonance imaging (MRI) method, which allows a robust radial acquisition of k-space data without being prone to imperfections of the MRI-system.

The present invention provides a magnetic resonance imaging (MRI) method in which a sample is subjected to a gradient echo imaging sequence having a plurality of basic sequence elements each of which comprises a radiofrequency (RF) pulse and at least one frequency encoding gradient moment $k_x$ for generating a magnetic resonance (MR) signal;

at least one first phase encoding gradient moment $k_y$ for phase encoding the MR signal; and a data acquisition period during which k-space data reflecting the MR signal are acquired.

The frequency encoding gradient moment $k_X$ and the first phase encoding gradient moment $k_y$ are applied such during the data acquisition period of each basic sequence element, that the k-space data are acquired in a radial direction and asymmetrically with respect to the center of k-space. The k-space data are acquired in the direction from the periphery towards the center of k-space.

By radially acquiring the k-space data from the periphery towards the center of k-space, i.e. by applying a centered-in asymmetrical radial acquisition scheme, the trajectory fidelity is considerably improved in the region of the k-space center, leading to an overall improved signal homogeneity in the final image. In image space, artifacts due to miscalibrations of the data acquisition trajectories are shifted from lower spatial image frequencies towards higher spatial image frequencies, such that they appear to be considerably less prominent in the obtained image. Background noise in the form of 'smearing' artifacts or of a 'halo-effect' are significantly less pronounced with a centered-in data acquisition trajectory as compared to a conventional centered-out trajectory.

The sample is usually a living or dead human body, but of course also a living or dead animal body or any other kind of sample can be taken as the sample. Due to the usual motion sensitivity of the gradient echo imaging sequence, proper fixation of the sample is preferred during data acquisition. The method is preferably used for thoracic, in particular pulmonary appliances. It can, however, also be used for cardiac, musculoskeletal, bone, cartilage, chest or encephalic imaging.

K-space is a term widely used in MRI and well known to the person skilled in the art and defines the spatial frequency domain of the measured image data in contrast to image space which is related with k-space by means of an (inverse) Fourier transformation. An acquisition of k-space data in the direction from the periphery of k-space to the center of k-space means that MR signals contributing to high spatial frequencies of the reconstructed image are acquired prior to MR signals contributing to low spatial frequencies.

In the gradient echo sequence, the frequency encoding gradient moment $k_x$ and the first phase encoding gradient moment $k_y$ are usually each reversed in the course of each basic sequence element, such that the transverse magnetization is first dephased and then rephased to form a MR echo at an echo time TE. The gradient echo sequence can be a spoiled gradient echo sequence (SPGR) or, which is preferred, a steady-state free precession (SSFP) sequence, in particular a balanced SSFP sequence.

The measuring principle of SPGR sequences, which are also known by the terms FLASH or $T_1$-FFE depending on the manufacturer of the MRI system, is usually characterized by the application of a series of consecutive radiofrequency (RF) pulses, with a repetition time interval TR between each of two consecutive RF pulses that is shorter than or in the same order of magnitude of the transverse relaxation time $T_2$ of the sample to be measured. Each of these RF pulses belongs to one basic sequence element. In order to suppress signals from previous RF excitations, a dephasing gradient moment is usually applied in frequency encoding (also called readout), phase encoding and/or slice selection direction prior to each RF pulse. RF spoiling can additionally be applied, in order to suppress MR signals from previous excitations. Phase encoding gradient moments $k_y$ which are normally applied in the basic sequence elements of the SPGR sequence for enabling a complete spatial reconstruction of the image, are usually rewound prior to the next RF excitation in the subsequent basic sequence element.

A large number of balanced and unbalanced SSFP imaging techniques have been described so far (e.g., see Bernstein M A, King K F, Zhou X J. Handbook of MRI Pulse Sequences: Elsevier Academic Press; 2004), which can be used in the method as proposed. SSFP imaging techniques are generally based on a gradient-echo MRI sequence having a repetition time TR between consecutive RF pulses that is typically much shorter than the transversal relaxation time $T_2$ of the sample. A common feature of rapid SSFP sequences is their mixed $T_2/T_1$ imaging contrast, which is a natural consequence of the short pulse repetition time (TR).

In balanced SSFP sequences, the nuclear spins causing the occurrence of the transverse magnetization are completely rephased by means of reversed gradients being applied along all spatial directions, within each basic sequence element or, in other words, within every TR-interval. Thus, in balanced SSFP sequences, the contribution of the remaining transverse magnetization of previous RF excitations to the MR signal is maximized.

The use of a balanced SSFP sequence as the gradient echo sequence is particularly advantageous, because with balanced SSFP the signal intensity of the acquired MR signal is still high towards the end of the acquisition period in each basic sequence element. Thus, when acquiring data in the region of k-space center by means of the method as indicated, the signal intensity does not decrease during the acquisition period. By contrast, with most other gradient echo sequences, the signal intensity of the MR-signal decreases significantly towards the end of the acquisition period.

Preferably, the k-space data are acquired in k-space in the form of a star, in particular in the form of a regular star, by the plurality of basic sequence elements. Usually, a single radial spoke of k-space data is acquired by each basic sequence element. From basic sequence element to basic sequence element, i.e. from TR-interval to TR-interval, the angular direction of the radial spoke is preferably rotated around k-space center by a certain angular increment, until a star-like k-space coverage is obtained. The star can be two-dimensional or three-dimensional.

The gradient echo imaging sequence can be applied such, that two-dimensional (2D) k-space data are acquired. The sequence can also be applied such, that three-dimensional (3D), i.e. volumetric k-space data are acquired. Also possible is the acquisition of multi-slice two-dimensional images.

If 3D k-space data are acquired, the RF pulse is preferably a non-slice selective RF pulse, and the basic sequence element additionally comprises at least one second phase encoding gradient moment $k_z$ for phase encoding the MR signal in a direction perpendicularly to the frequency encoding gradient $k_x$ and perpendicularly to the direction of the first phase encoding gradient moment $k_y$ in k-space.

In case of a 3D data acquisition, the k-space data are preferably acquired in the form of consecutive radial planes by the plurality of basic sequence elements, leading to a cylindrical k-space coverage. Each of these radial planes is oriented such in k-space that its surface normal extends in parallel to a plane spanned by the $k_x$- and $k_y$-axis. With respect to the $k_x$-$k_y$-plane, the multiple radial planes extend from the k-space center radially outwardly and differ in their respective positions by a certain angular increment which can be a constant or a variable increment.

In order to avoid abruptly and fast switching encoding gradients leading to eddy-currents, it is preferable to acquire the consecutive radial planes of k-space data in alternating directions along the direction of the second phase encoding gradient moment $k_z$. Thus, a "zig-zag" sampling pattern along the $k_z$-direction in combination with small angular increments is preferably applied for the acquisition of the 3D k-space data.

Preferably, in order to achieve a high SNR and reduce banding artifacts, the repetition time TR which separates the RF pulses of two consecutive basic sequence elements is less than 3 ms, particularly less than 2 ms. Due to the centered-out sampling scheme, the ratio of the echo-time TE, at which the k-space data are acquired at the center of k-space after each RF pulse, to the repetition time TR, i.e. TE/TR, is at least 0.5.

Additionally, a magnetic resonance imaging (MRI) system is provided which is configured to carry out the MRI method as indicated. Usually, such a MRI system comprises at least a main magnet for generating a main, particularly static magnetic field $B_0$ at a location of a sample to be imaged, in order to at least partly align nuclear spins of the sample;

an excitation module or device for applying a sequence of radio frequency (RF) pulses to the sample, in order to repeatedly excite the nuclear spins of the sample;

a gradient module or system for generating temporary magnetic gradient fields at a location of the sample;

an acquisition module or device, in particular an image acquisition module or device, for acquiring the magnetic resonance (MR) signals produced by excited nuclear spins of the sample; and a control module configured for controlling the excitation module, the gradient module and the acquisition module such, that the MRI method as indicated is carried out.

It is preferred, that the magnetic field $B_0$ generated by the main magnet is essentially uniform at least in the region of the sample. The magnitude of the magnetic field generated by the main magnet is preferably larger than 0.5 Tesla, more preferably larger than 1 Tesla, even more preferably larger than 2 Tesla and most preferably larger than 5 Tesla. With a stronger magnetic field, a better signal-to-noise ratio can be achieved, but imaging artifacts are also more pronounced.

The MRI system preferably also comprises an image reconstruction module for reconstructing images based on the acquired k-space data.

Furthermore, a computer program, preferably stored on a storage device readable by a computer, is provided for controlling a magnetic resonance imaging (MRI) system as described. The computer program comprises at least executable instructions to employ a gradient echo imaging sequence on the MRI system in such a way, that k-space data are asymmetrically acquired in a radial direction from the periphery towards the center of k-space, i.e. for carrying out a method as indicated.

Thus, the computer program carries out central parts of the method described above when executed in a processor of a MRI system or in a processer being connected with a MRI system. The computer program is usually realized as a computer program code element which comprises computer-implemented instructions to cause a processor to carry out a particular method. It can be provided in any suitable form, including source code or object code. In particular, it can be stored on a computer-readable medium or embodied in a data stream. The data stream may be accessible through a network such as the Internet.

BRIEF DESCRIPTION OF THE DRAWINGS

Preferred embodiments of the invention are described in the following with reference to the drawings, which only serve for illustration purposes, but have no limiting effects. In the drawings it is shown.

DESCRIPTION OF THE INVENTION

Figure 1:
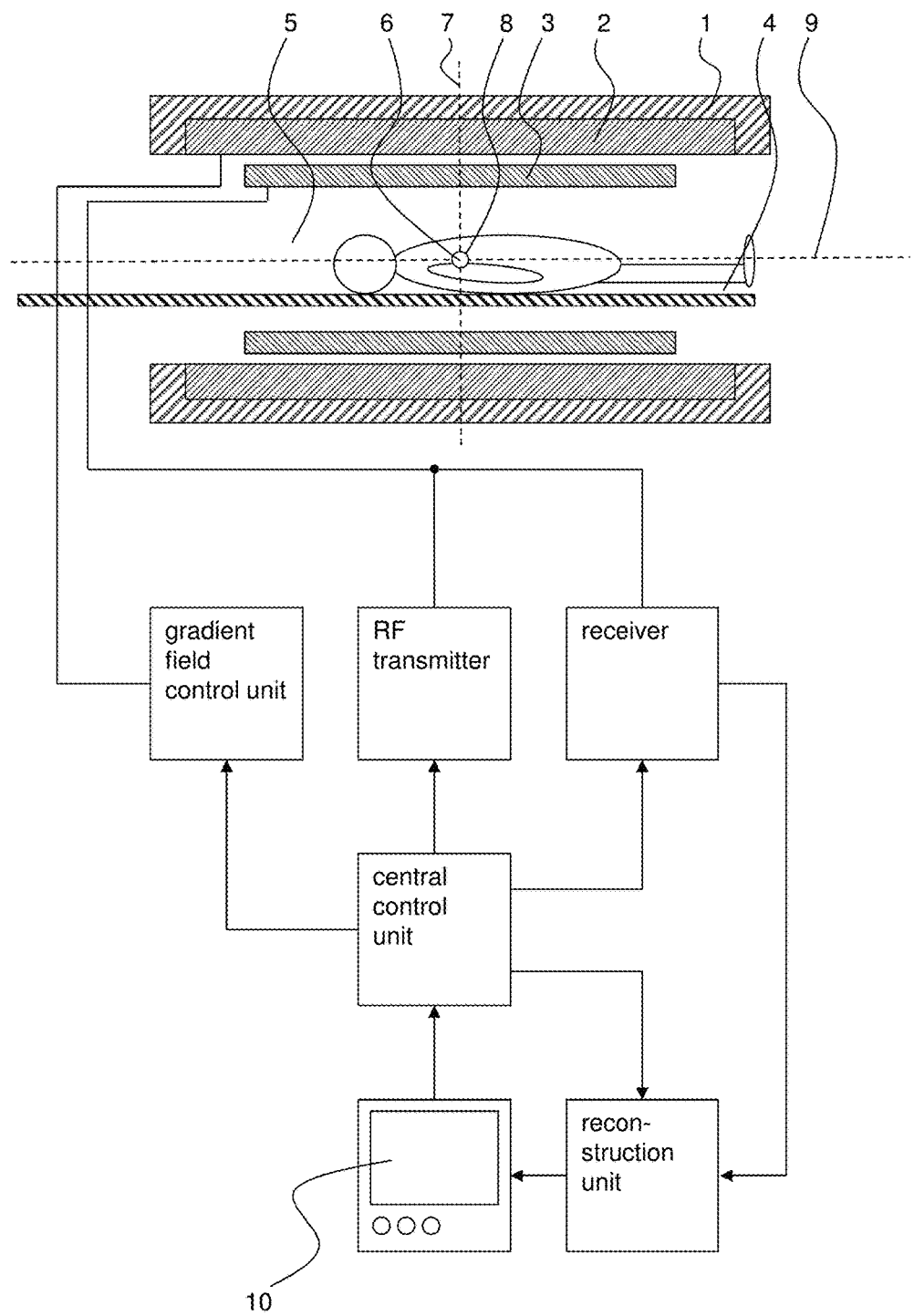
FIG. 1 a schematic illustration of a MRI system for carrying out the inventive method according to a first embodiment.

In FIG. 1, an exemplary MRI system is shown which serves to carry out the inventive method in which a sample 5, such as a living or dead human or animal body, is subjected to a gradient echo imaging sequence with asymmetric radial acquisition of k-space data.

The MRI system comprises a main magnet 1 for producing a main magnetic field $B_0$. The main magnet 1 usually has the essential shape of a hollow cylinder with a horizontal bore. Inside the bore of the main magnet 1 a magnetic field is present, which is essentially uniform at least in the region of the isocenter 6 of the main magnet 1. The main magnet 1 serves to at least partly align the nuclear spins of a sample 5 arranged in the bore. Of course, the magnet 1 does not necessarily be cylinder-shaped, but could for example also be C-shaped.

The sample 5 is arranged in such a way on a moving table 4 in the bore of the main magnet 1, that the part of the sample 5, which is to be imaged by the inventive method, is arranged in the region of the isocenter 6 of the magnet 1. In the present example according to FIG. 1, human lung parenchyma is assessed. In order to avoid motion artifacts, the sample 5, i.e. a patient, is immobilized during data acquisition by means of a corresponding fixation (not shown). In order to avoid motion artifacts due to diaphragm movement, the patient is instructed to hold his breath during the entire image acquisition.

The main magnet 1 has a z-axis 9 which coincides with the central longitudinal axis defined by the cylindrical shape of the magnet 1. Together with a x-axis 7 and a y-axis 8, which each extend in mutually perpendicular directions with respect to the z-axis 9, the z-axis 9 defines a Cartesian coordinate system of the MRI system, having its origin at the isocenter of the magnet 1.

In order to produce a magnetic field which linearly varies in the direction of the x-axis 7, the y-axis 8 and/or the z-axis 9, the MRI-system comprises a gradient system 2 including several coils for producing these varying magnetic fields. A radiofrequency (RF) coil 3 is provided for generating a transmit field $B_1$, in order to repetitively excite the nuclear spins of the sample 5 by means of RF pulses. The RF coil 3 is additionally connected with a receiver for the reception of the MR signals measured by the RF coil. Both the RF transmitter and the receiver are controlled by a central control unit.

The receiver, which constitutes an acquisition module together with the RF coil 3, is connected with a reconstruction unit, in which the acquired MR signals are reconstructed into images. The images are sent from the reconstruction unit to a user interface 10, usually realized by a customary personal computer, in which the images are post processed.

Figure 2:
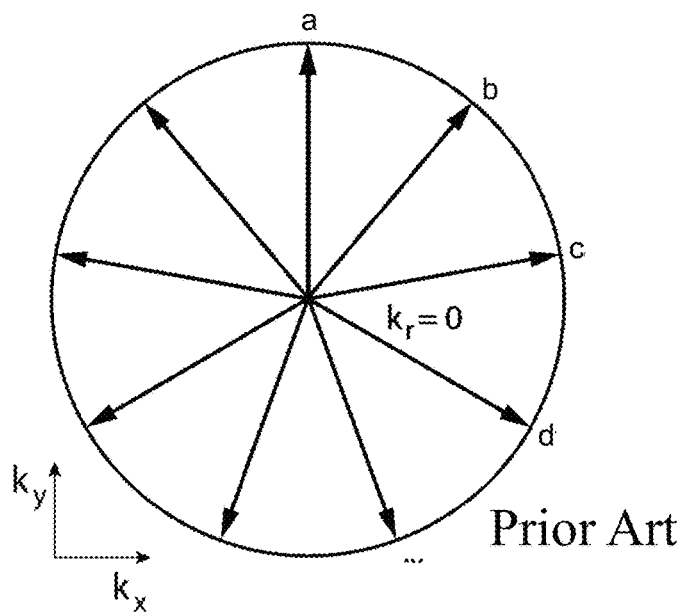
FIG. 2 a schematic illustration of a 2D centered-out half-echo radial k-space data acquisition according to the prior art.

FIG. 2 shows a 2D centered-out radial sampling scheme according to the prior art. With this sampling scheme, data acquisition is carried out by means of a customary gradient echo sequence in the direction from the center towards the periphery of k-space. The gradient echo sequence comprises a plurality of basic sequence elements, in each of which one radial spoke a, b, c, d etc. is acquired. The radial spokes a, b, c, d of successive basic sequence 12 elements differ by a certain angular increment from each other. By the plurality of basic sequence elements 12 of the gradient echo sequence a star-like k-space coverage is achieved for the acquired data, as shown in FIG. 2.

With such a centered-out radial acquisition scheme as shown in FIG. 2, however, an increased diffuse background noise ('smearing' artifacts or 'halo-effect') is observed in the final images due to imperfections of the MRI system, especially if applying a balanced SSFP imaging sequence.

Figure 3:
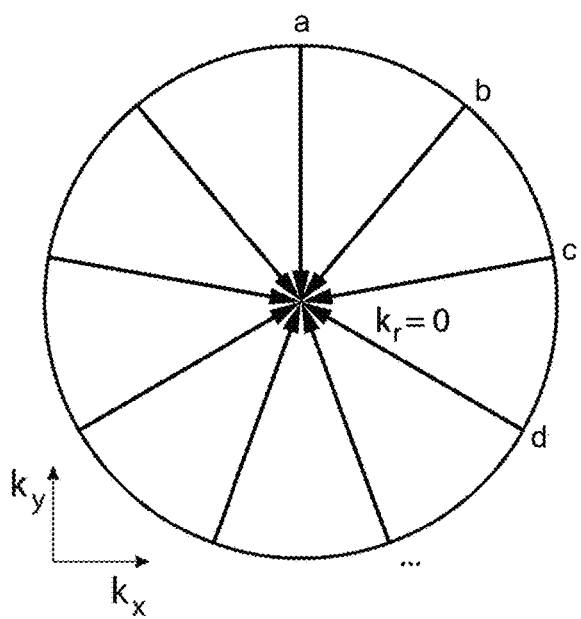
FIG. 3 a schematic illustration of a 2D centered-in half-echo radial k-space data acquisition according to an exemplary inventive embodiment.

In FIG. 3, a 2D centered-in radial half-echo sampling scheme according to the invention is illustrated. In contrast to the sampling scheme as shown in FIG. 2, k-space data are acquired in radial directions from the periphery towards the center of k-space. With this centered-in sampling scheme, artifacts caused by system imperfections are more prominent at higher spatial image frequencies $k_x$ and $k_y$, than at lower spatial image frequencies $k_x$ and $k_y$ in the region of k-space center. Thus, the respective artifacts are less pronounced in the final image in the eye of the observer. Particularly no 'smearing' artifacts or 'halo-effects' are obtained.

The sampling scheme as shown in FIG. 3 is preferably applied in combination with a balanced SSFP imaging sequence. Due to the star-like acquisition scheme and the employment of a balanced SSFP imaging sequence, which is also known under the name TrueFISP, the respective method is also termed "TrueSTAR" in the following.

Thus, with TrueSTAR imaging, the benefits of both the short repetition time TR, resulting in reduced banding artifacts, and the improved trajectory fidelity in the k-space center are combined, leading to an overall improved signal homogeneity.

Figure 4:
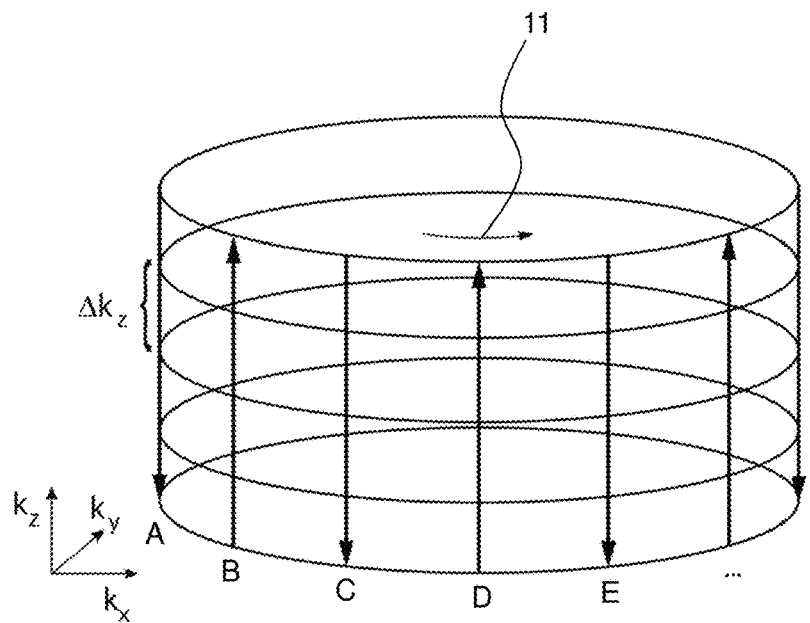
FIG. 4 a schematic illustration of a 3D centered-in half-echo radial k-space data acquisition according to another exemplary inventive embodiment.

FIG. 4 shows a schematic centered-in radial half-echo sampling scheme for a 3D acquisition. The data acquisition corresponds to a 3D stack-of-stars sampling scheme, in which radial spokes are acquired on different $k_z$-planes differing by $\Delta k_z$ until a complete radial plane A of k-space data is obtained. Apart from a frequency encoding gradient $k_x$ and a first phase encoding gradient $k_y$, a second phase encoding gradient IQ is applied after a non-selective RF excitation in each basic sequence element 12, in order to achieve a 3D k-space coverage. After having acquired a first radial plane A, the frequency encoding gradient moment $k_x$ and the first phase encoding gradient moment $k_y$ of the respective basic sequence elements 12 are set such by the central control unit that a radial plane B is acquired, which differs from the first radial plane A by a certain angular increment in the direction around the $k_z$-axis, i.e. in the direction of arrow 11 in FIG. 4. The rotation of the radial acquisition plane is continued by the angular increment in the direction of arrow 11, in order to acquire further radial planes C, D, E etc. At the end, a cylindrical 3D coverage of k-space is achieved.

The direction in which the radial spokes of each radial plane A, B, C, D, E etc. are acquired along the $k_z$-direction is reversed from each radial plane to the next radial plane. In this way, fast switching of the second phase encoding gradient $k_z$ can be avoided and, thus, the occurrence of eddy-currents within the sample 5 can be minimized.

Figure 5:
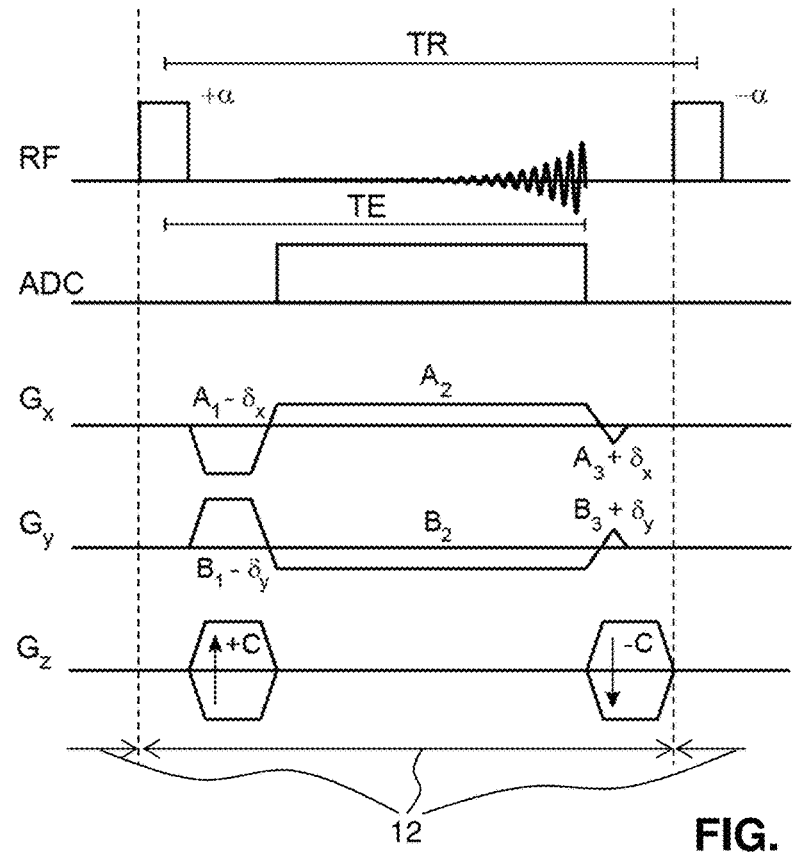
FIG. 5 a basic sequence element of the gradient echo sequence of the inventive MRI method.

FIG. 5 shows a basic sequence element 12 of the balanced SSFP sequence, in which one radial spoke a, b, c, d of k-space is acquired. The entire balanced SSFP sequence comprises a plurality of such basic sequence elements 12. Due to the centered-in acquisition scheme, the echo time TE at which data of k-space center are acquired coincides with the end of a period during which data acquisition (indicated by ADC in FIG. 5) occurs. The non-selective RF pulses of successive basic sequence elements are applied such by the central control unit that the magnetization is excited in alternate directions, as is indicated by the respective algebraic signs of the flip angles α associated with the RF pulses in FIG. 5.

By means of the frequency encoding gradient $G_x$ and the first phase encoding gradient $G_y$, the magnetization is first dephased by applying a frequency encoding gradient moment $k_x$ of $A_1$ and a first phase encoding gradient moment $k_y$ of $B_1$ and then rephased to form an echo at TE by means of a further frequency encoding gradient moment $k_x$ of $A_2$ and a further first phase encoding gradient moment $k_y$ of $B_2$. By means of a second phase encoding gradient $G_z$, a second phase encoding gradient moment $k_z$ of +C is applied, in order to phase encode the MR signal in the $k_z$-direction.

In the sequence as shown in FIG. 5, time delays of the encoding gradients $G_x$, $G_y$ and $G_z$ are corrected by an angular dependent modification of corresponding gradient moments (Peters D C, Derbyshire J A, McVeigh E R. Centering the projection reconstruction trajectory: reducing gradient delay errors. Magn Reson Med. 2003 July; 50(1):1-6). To this end, corrective gradient moments $\delta_x$ and $\delta_y$ were subtracted from the dephasing gradients $A_1$ and $B_1$, respectively, and re-added to the rephasing gradient after the readout block to balance gradient moments within every TR.

In addition, to smoothen the transition into steady state, 10 dummy TRs with linearly increasing flip angles (from α/10 to α) are preferably used for 2D acquisitions (Deshpande V S, Chung Y C, Zhang Q, Shea S M, Li D. Reduction of transient signal oscillations in true-FISP using a linear flip angle series magnetization preparation. Magn Reson Med 2003; 49:151-157), whereas for 3D scans, a train of 100 dummy TRs with constant flip angle can be used.

Experiments

MRI Data Acquisitions

Concrete experiments were performed on a 1.5T whole-body MR-scanner (MAGNETOM Avanto, offering a gradient peak amplitude of 40 mT/m and a maximum slew rate of 200 T/m/s; Siemens Healthcare, Erlangen, Germany) using 12-channel thorax and 24-channel spine coil for signal reception and body-coil for transmission. Centered-in half-radial TrueFISP (TrueSTAR), centered-out half-radial TrueFISP and symmetric radial TrueFISP scanning was performed in 2D and 3D in phantom and in healthy volunteer. In vivo coronal chest scans were obtained in expiratory breath hold in supine position. Generally, scans were performed with predefined default shim settings (i.e. tune up mode).

Radial 2D scans were performed with the following parameters: TE/TR=0.94/1.62 ms (TrueSTAR-centered-in sampling), TE/TR=0.66/1.62 ms (centered-out sampling), TE/TR=0.93/1.86 ms (symmetric sampling), sinc-shaped RF pulse length τ=300 μs, field-of-view (FOV)=400 mm², in-plane resolution=3.1×3.1 mm², slice thickness=8 mm, flip angle α=30°, bandwidth=2056 Hz/pixel, 250 half-radial spokes (centered-in and centered-out sampling), 200 radial spokes (symmetric sampling), 64 images, total acquisition time per image=0.4 s, reconstruction matrix=128×128.

Stack-of-stars radial 3D imaging was performed with: TE/TR=0.36/1.21 ms (TrueSTAR-centered-in sampling), TE/TR=0.85/1.21 ms (centered-out sampling), TE/TR=0.85/1.70 ms (symmetric sampling), rectangular RF pulse τ=100 μs, flip angle α=20°, bandwidth=1700 Hz/pixel, isotropic resolution=3.1 mm³, 72 slice encoding steps, 100% slice resolution, 300 half-radial spokes (centered-in and centered-out sampling), 220 radial spokes (symmetric sampling), TA=26.7 s, reconstruction matrix=128×128×72. All scans were performed with twofold readout oversampling. Additionally, a 3D stack-of-stars scan with higher spatial resolution of 2.5 mm³ and centered-out sampling was performed. The following parameters were modified: TE/TR=0.91/1.37 ms (TrueSTAR-centered-in sampling), 88 slice encoding steps, 75% slice resolution, 400 half-radial spokes, TA=36.3 s, bicubic interpolation factor 2, reconstruction matrix=320×320×176.

Image Reconstruction and Analysis

All images were reconstructed on the MR-scanner using a standard gridding algorithm with a Kaiser-Bessel kernel. The RamLak filter was used as the density compensation function. The scan performed with 2.5 mm³ isotropic resolution was reconstructed using a bicubic interpolation.

Results

Figure 6:
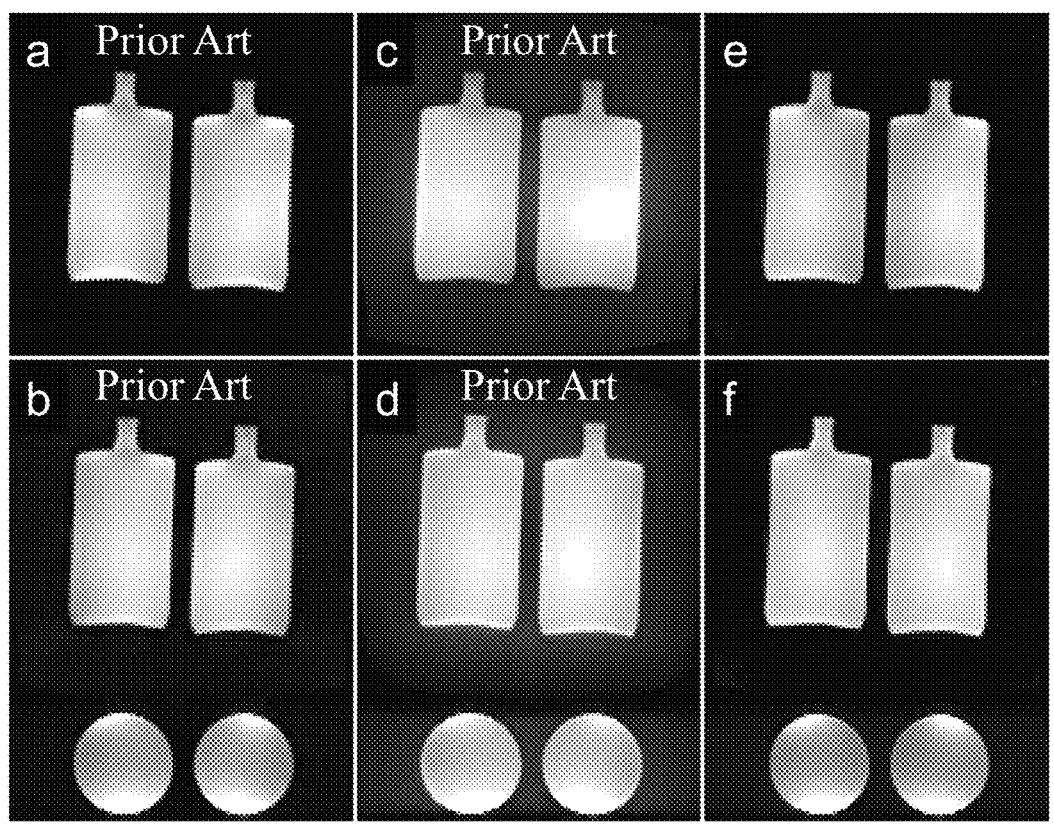
FIG. 6 the results of phantom scans performed with 2D radial imaging in coronal view (upper row) and with 3D stack-of-stars imaging (lower row) in coronal and axial view. (a,b) Fully symmetric radial sampling. (c,d) Centered-out, half-echo radial sampling. (e,f) TrueSTAR, i.e., centered-in half-radial, sampling.

Images reconstructed from phantom scans using 2D radial and 3D stack-of-stars TrueSTAR, as well as contemporary sampling schemes (i.e., symmetric and centered-out), are shown in FIG. 6. Despite a correction of gradient time delays, both 2D and 3D images obtained with centered-out trajectories (2D: FIG. 6c; 3D: FIG. 6d) are noticeably blurred and show a typical 'halo effect' in the central image region. This artifact appears as a result of residual gradient oscillations and other short-lived gradient-related system imperfections arising immediately after ramp up. This is in contrast to TrueSTAR imaging (2D: FIG. 6e; 3D: FIG. 6f), where a similar image quality can be achieved, as compared to a scanning with fully symmetric echoes (2D: FIG. 6a; 3D: FIG. 6b).

Figure 7:
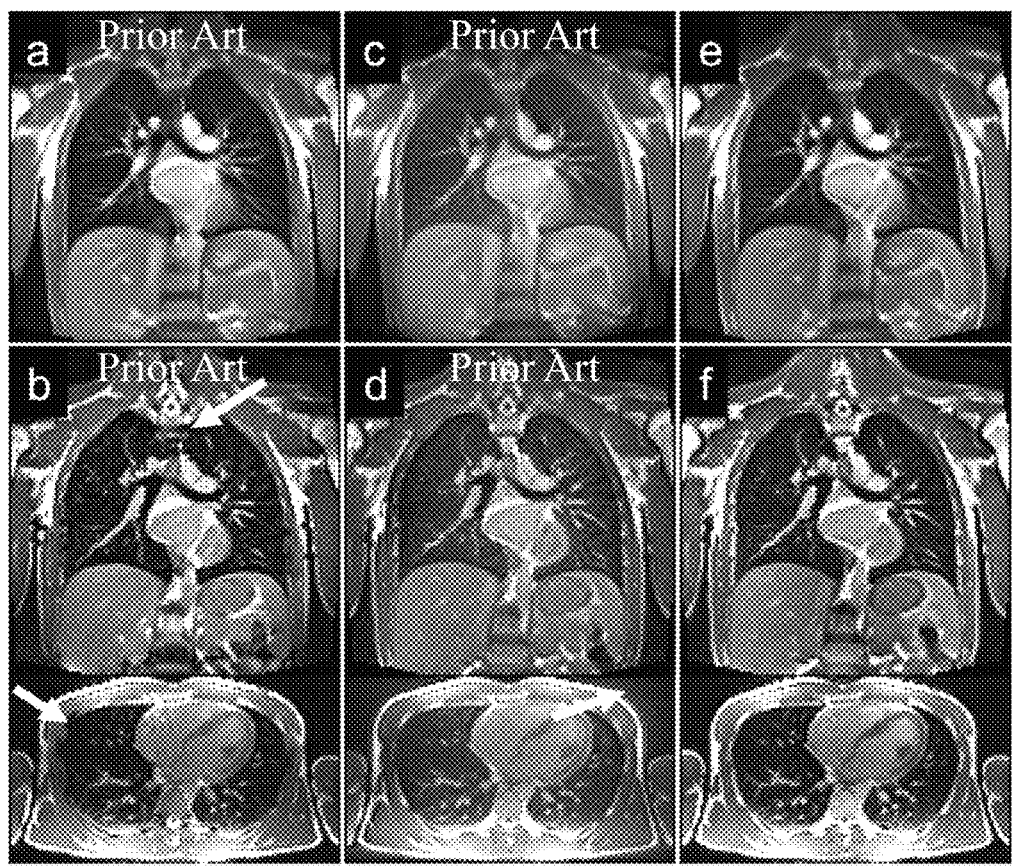
FIG. 7 illustrative native chest images obtained in a healthy volunteer in breath-hold at 1.5T in coronal view (upper row) and with 3D stack-of-stars imaging (lower row) in coronal and axial view. (a,b) Fully symmetric radial sampling. (c,d) Centered-out half-echo radial sampling. (e,f) TrueSTAR, i.e., centered-in half-radial, sampling.

Illustrative in vivo chest images from a healthy volunteer acquired in single breath-hold and for all three k-space sampling schemes are shown in FIG. 7. As a result of strong perturbations in the main magnetic field, the symmetric TrueFISP acquisition (FIGS. 7a and 7b) is flawed by increased banding artifacts (see arrows in FIG. 7b) as compared to the centered-out TrueFISP and TrueSTAR acquisitions with shortened TR. This becomes especially noticeable on the coronal view in the spinal region and in the periphery of the field-of-view as well as in the axial view for the rib cage of 3D stack-of-stars TrueFISP. Although banding artifacts are reduced in the centered-out mode (FIGS. 7c and 7d), miscalibrations of the trajectories in the k-space center caused significant smearing, i.e. a 'halo effect' (see arrow in FIG. 7d), that can wrongly give an impression of increased signal intensity in the lung tissue. This is in contrast to TrueSTAR imaging (FIGS. 7e and 7f) which combines the benefits of both the short TR, resulting in reduced banding artifacts, and the improved trajectory fidelity in the k-space center, leading to an overall improved signal homogeneity.

The invention is of course not limited to the preceding presented embodiments and examples, and a plurality of modifications is possible. For example, instead of balanced SSFP, other gradient echo sequences can be applied. The radial spokes of the star as shown in FIG. 3 do not necessarily have to be arranged with constant angular increments relative to each other, but could also be distributed according to the golden angle-principle for example. A plurality of further modifications is possible.

| REFERENCE NUMERALS | |
|---|---|
| 1 | Main magnet |
| 2 | Gradient system |
| 3 | RF coil |
| 4 | Moving table |
| 5 | Sample |
| 6 | Isocenter |
| 7 | X-axis |
| 8 | Y-axis |
| 9 | Z-axis |
| 10 | User interface |
| 11 | Arrow |
| 12 | Basic sequence element |
| a, b, c, d | Radial spokes |
| A, B, C, D, E | Radial planes |

The invention claimed is:

1. A magnetic resonance imaging (MRI) method comprising subjecting a sample to a gradient echo imaging sequence having a plurality of basic sequence elements with a magnetic resonance imaging (MRI) machine, wherein each of the plurality of basic sequence elements comprises:
applying a radiofrequency (RF) pulse and at least one frequency encoding gradient moment $k_x$, thereby generating a magnetic resonance (MR) signal;
applying at least one first phase encoding gradient moment $k_y$, thereby phase encoding the MR signal; and
acquiring k-space data reflecting the MR signal during a data acquisition period; and
wherein the frequency encoding gradient moment $k_x$ and the first phase encoding gradient moment $k_y$ are applied during the data acquisition period of each of the plurality of basic sequence elements, such that the k-space data are acquired by means of a centered-in radial data acquisition trajectory in the direction from a periphery towards a center of k-space and asymmetrically with respect to the center of k-space.

2. The MRI method as claimed in claim 1, wherein the gradient echo imaging sequence is a balanced steady-state free precession (SSFP) sequence.

3. The MRI method as claimed in claim 1, wherein the k-space data are acquired in k-space in the form of a star, in particular in the form of a regular star, by the plurality of basic sequence elements.

4. The MRI method as claimed in claim 1, wherein the gradient echo imaging sequence is applied such that three-dimensional (3D) k-space data are acquired.

5. The MRI method as claimed in claim 4, wherein the RF pulse is a non-slice selective RF pulse, and wherein each of the plurality of basic sequence elements additionally comprises at least one second phase encoding gradient moment $k_z$ for phase encoding the MR signal in a direction perpendicularly to the direction of the first phase encoding gradient moment $k_y$ in k-space.

6. The MRI method as claimed in claim 5, wherein the k-space data are acquired in k-space in the form of consecutive radial planes by the plurality of basic sequence elements, leading to a cylindrical k-space coverage.

7. The MRI method as claimed in claim 6, wherein the consecutive radial planes of k-space data are acquired in alternating directions along the direction of the second phase encoding gradient moment $k_z$ in k-space.

8. The MRI method as claimed in claim 1, wherein the RF pulses of each of two consecutive basic sequence elements are separated from each other by a repetition time TR of less than 3 ms, particularly of less than 2 ms.

9. A magnetic resonance imaging (MRI) machine configured to carry out a MRI method by subjecting a sample to a gradient echo imaging sequence having a plurality of basic sequence elements, wherein each of the plurality of basic sequence elements comprises:
applying a radiofrequency (RF) pulse and at least one frequency encoding gradient moment $k_x$, thereby generating a magnetic resonance (MR) signal;
applying at least one first phase encoding gradient moment $k_y$, thereby phase encoding the MR signal; and
acquiring k-space data reflecting the MR signal are acquired during a data acquisition period; and
wherein the frequency encoding gradient moment $k_x$ and the first phase encoding gradient moment $k_y$ are applied during the data acquisition period of each of the plurality of basic sequence elements, such that the k-space data are acquired by means of a centered-in radial data acquisition trajectory in a direction from a periphery towards a center of k-space and asymmetrically with respect to the center of k-space.

10. A computer program product for controlling a magnetic resonance imaging (MRI) machine, the computer program product comprising a non-transitory computer-readable medium comprising executable instructions that when executed by the MRI machine cause the MRI machine to carry out a MRI method comprising subjecting a sample to a gradient echo imaging sequence having a plurality of basic sequence elements, wherein each of a plurality of basic elements comprises:
applying a radiofrequency (RF) pulse and at least one frequency encoding gradient moment $k_x$, thereby generating a magnetic resonance (MR) signal;
applying at least one first phase encoding gradient moment $k_y$, thereby phase encoding the MR signal; and
acquiring k-space data reflecting the MR signal during a data acquisition period; and
wherein the frequency encoding gradient moment $k_x$ and the first phase encoding gradient moment $k_y$ are applied during the data acquisition period of each of the plurality of basic sequence elements, such that the k-space data are acquired by means of a centered-in radial data acquisition trajectory in a direction from a periphery towards a center of k-space and asymmetrically with respect to the center of k-space.

* * * * *